(12) United States Patent
Dabral et al.

(10) Patent No.: US 7,250,333 B2
(45) Date of Patent: Jul. 31, 2007

(54) METHOD OF FABRICATING A LINEARIZED OUTPUT DRIVER AND TERMINATOR

(75) Inventors: Sanjay Dabral, Palo Alto, CA (US); Krishna Seshan, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 12 days.

(21) Appl. No.: 10/394,977

(22) Filed: Mar. 20, 2003

(65) Prior Publication Data

US 2004/0038475 A1 Feb. 26, 2004

Related U.S. Application Data

(62) Division of application No. 09/609,434, filed on Jun. 30, 2000, now Pat. No. 6,646,324.

(51) Int. Cl.
*H01L 21/8234* (2006.01)
*H01L 21/8244* (2006.01)

(52) U.S. Cl. .............. 438/238; 438/382; 438/383

(58) Field of Classification Search .......... 257/363, 257/364, 540, 536, 541, 543; 438/238, 275, 438/281, 382, 383
See application file for complete search history.

(56) References Cited

U.S. PATENT DOCUMENTS

| | | | |
|---|---|---|---|
| 5,132,757 A * | 7/1992 | Tignor et al. ............ | 257/408 |
| 5,493,142 A | 2/1996 | Randazzo et al. | |
| 5,498,892 A | 3/1996 | Walker et al. | |
| 6,100,127 A | 8/2000 | Wu | |
| 6,482,714 B1 * | 11/2002 | Hieda et al. ............. | 438/416 |
| 2002/0060343 A1 * | 5/2002 | Gauthier et al. .......... | 257/363 |

OTHER PUBLICATIONS

Chapter 6 "ESD and I/O Interaction," Basic ESD and I/O Design, Sanjay Dabral and Timothy Maloney of Intel Corporation, Santa Clara, California, John Wiley & Sons, Inc. 1998, pp. 218-245.
Chapter 2 "CMOS Technology," CMOS Analog Circuit Design, Phillip E. Allen and Douglas R. Holberg, Oxford University Press, 1987, pp. 29-95.
Chapter 8-12 of "Semiconductor Devices Physics and Technology", John Wiley & Sons, Bell Telephone Laboratories, Inc., 1985, pp. 301-506.

* cited by examiner

*Primary Examiner*—Zandra V. Smith
*Assistant Examiner*—Khanh Duong
(74) *Attorney, Agent, or Firm*—Blakely, Sokoloff, Taylor & Zafman LLP

(57) ABSTRACT

A method and apparatus for a linearized output driver and terminator is described. In one embodiment the method includes forming a gate electrode on a substrate, the portion of the substrate covered by the gate electrode defining a channel. The method further includes forming a first source/drain doped region on laterally opposed sides of the gate electrode in the substrate. The method also includes forming a spacer on laterally opposed sides of the gate electrode on the substrate. The method also includes forming a linearized drain contact region at a location within the first source/drain doped region sufficiently distant from the gate electrode to define a series resistor in the first source/drain doped region disposed between the gate electrode and the linearized drain contact area based on an expected resistivity of the source/drain doped region, the series resistor coupled electrically to the channel.

18 Claims, 7 Drawing Sheets

METHOD OF FABRICATING A LINEARIZED OUTPUT DRIVER AND TERMINATOR

CROSS REFERENCE TO RELATED APPLICATIONS

This application is a divisional of, and claims priority from, U.S. patent application Ser. No. 09/609,434, filed Jun. 30, 2000, now U.S. Pat. No. 6,646,324.

BACKGROUND OF THE INVENTION

1. Field of the Invention

The present invention is related to the field of semiconductor circuit design and processing and more particularly to design of buffers suitable for use with transmission line conductors associated with integrated circuits.

2. Description of the Related Art

In many environments in which semiconductor devices are used, the conductors used to link the various devices behave in a manner similar to a transmission line. FIG. 1A illustrates a prior art transmission line environment. Buffer 110 drives transmission line 120, which is terminated to ground by termination impedance 130. Termination impedance 130 and buffer 110 preferably have the same impedance $Z_0$. With such a matched impedance situation, reflections are minimized leading to enhanced signal quality.

It is common to use resistive termination for buses on printed circuit boards, and many semiconductor devices are mounted in packaged form on printed circuit boards. Resistors have a well-known voltage transfer curve (IV curve). Ideally, a resistor has a linear voltage transfer curve, and a typical resistor may be assumed to have an ideal or linear voltage transfer curve. However, the buffers contained within semiconductor devices (such as buffer 110) rarely have a linear voltage transfer curve.

FIG. 1B illustrates a voltage transfer curve plot for various circuit elements. In particular, the straight line marked $R_{ideal}$ represents the linear voltage transfer curve of a resistor and the curved lines represent voltage transfer curves for an insulated gate FET device. Moreover, the dashed lines $R_{ac1}$ and $R_{ac2}$ represent the slope of the IV curve for the insulated gate FET at two regions, and it will be apparent that the difference in slope between $R_{ac1}$ and $R_{ac2}$ is significant. An insulated gate FET biased in a certain operational area may be expected to behave as a resistor for small deviations from the bias point (small signals). $R_{ac1}$ and $R_{ac2}$ may represent the resistance of an insulated gate FET for small signals when biased at the points where the corresponding IV curve of the insulated gate FET intersects those lines. The nonlinear MOS IV characteristics can result in imperfect termination, thereby increasing inter-symbol interference and degrading signal quality.

It is recognized that a combination of the insulated gate FET and an additional resistor (such as an off-chip series resistor for example) may achieve a more linear IV characteristic. However, this requires an additional component and corresponding opportunities for yield loss or variation in the circuitry. Similarly, a resistor may be formed on-chip between the bond pad and the insulated gate FET structure (or between the insulated gate FET structure and a power/ground rail). However, this may also require additional processing steps, may use up area that must be dedicated at the edge of the device, and may result in additional constraints on the overall design of the device.

SUMMARY OF THE INVENTION

A method and apparatus for a linearized output driver and terminator is described. In one embodiment the method includes forming a gate electrode on a substrate, the portion of the substrate covered by the gate electrode defining a channel. The method further includes forming a first source/drain doped region on laterally opposed sides of the gate electrode in the substrate. The method also includes forming a spacer on laterally opposed sides of the gate electrode on the substrate. The method also includes forming a linearized drain contact region at a location within the first source/drain doped region sufficiently distant from the gate electrode to define a series resistor in the first source/drain doped region disposed between the gate electrode and the linearized drain contact area based on an expected resistivity of the source/drain doped region, the series resistor coupled electrically to the channel.

BRIEF DESCRIPTION OF THE DRAWINGS

The present invention is illustrated by way of example and not limitation in the accompanying figures.

DETAILED DESCRIPTION

A method and apparatus for a linearized output driver and terminator is described. In the following description, for purposes of explanation, numerous specific details are set forth in order to provide a thorough understanding of the invention. It will be apparent, however, to one skilled in the art that the invention can be practiced without these specific details. In other instances, structures and devices are shown in block diagram form in order to avoid obscuring the invention.

Reference in the specification to "one embodiment" or "an embodiment" means that a particular feature, structure, or characteristic described in connection with the embodiment is included in at least one embodiment of the invention.

The appearances of the phrase "in one embodiment" in various places in the specification are not necessarily all referring to the same embodiment, nor are separate or alternative embodiments mutually exclusive of other embodiments.

Throughout the description, reference is made to structures which are formed, and this may mean a variety of things to one skilled in the art. For example, an implant layer may be formed through diffusion or ion implantation for example. Oxides may be formed through CVD or other methods. Additionally, the description refers to insulated gate FETs (Field Effect Transistors), a common embodiment of which is a MOSFET.

A method and apparatus are presented in which an insulated gate FET suitable for use in a transmission line environment and formation of such an insulated gate FET is illustrated. The insulated gate FET has formed within it a series resistor which linearizes the voltage transfer curve of the insulated gate FET. Furthermore, the series resistor is formed during the normal processing of the integrated circuit containing the insulated gate FET, thus reducing the potential for additional yield loss or process complexity due to the presence of the resistor. Additionally, the series resistor may be expected to occupy a relatively small area and have a reasonably predictable resistance for layout and circuit design purposes.

Figure 1A:
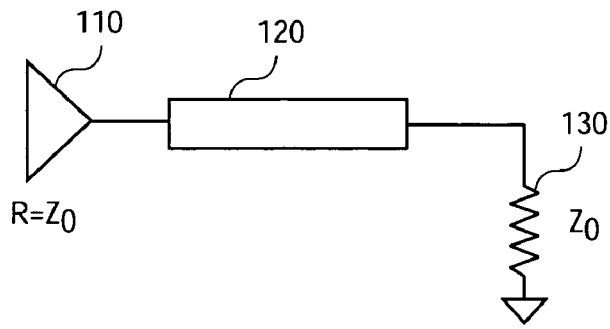
FIG. 1A illustrates a prior art transmission line environment.
Figure 1B:
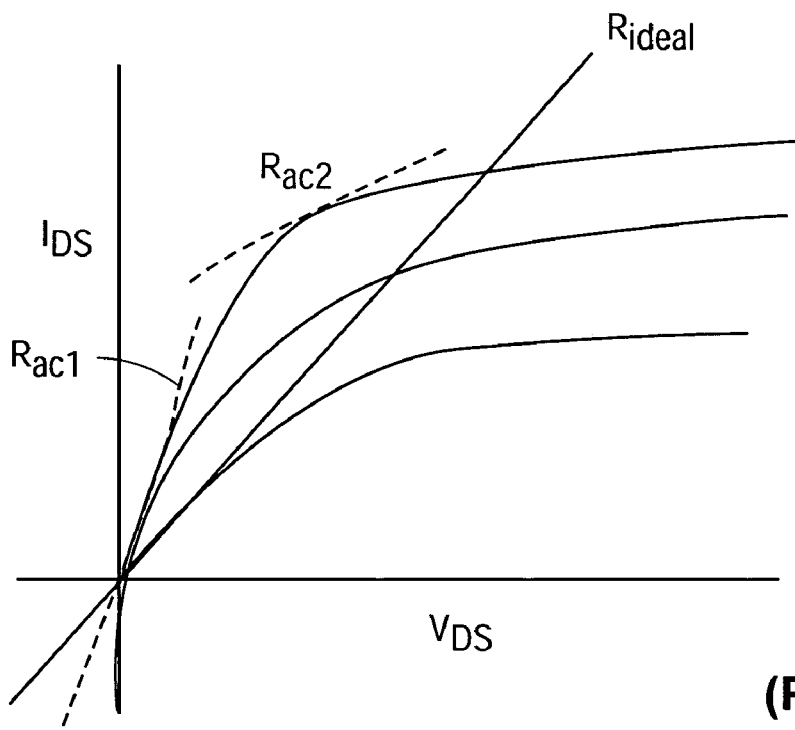
FIG. 1B illustrates a voltage-current plot for various circuit elements.
Figure 2:
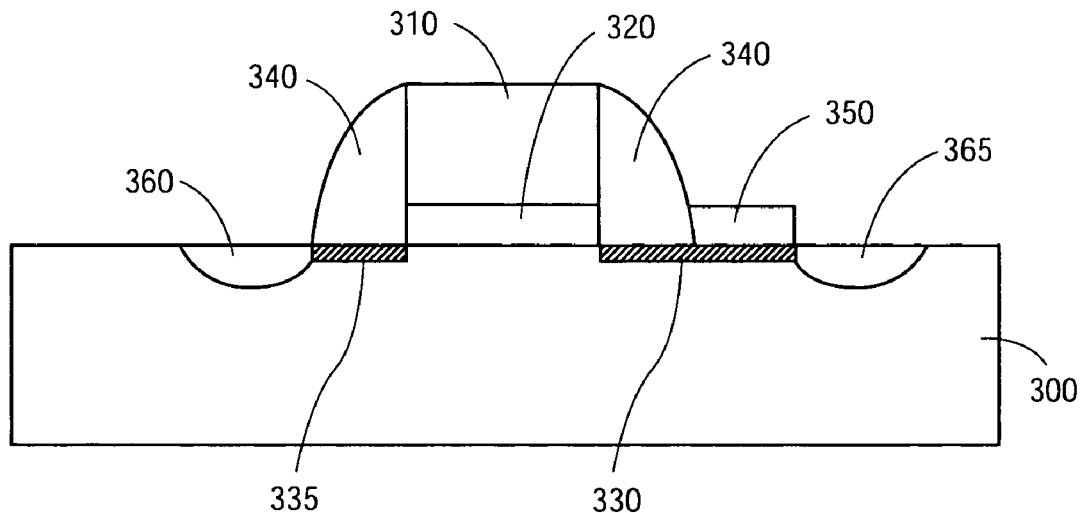
FIG. 2 illustrates an embodiment of an insulated gate FET.

FIG. 2 illustrates an embodiment of an insulated gate FET. Substrate 300 may be a semiconductor or a doped portion of a semiconductor. Formed on substrate 300 is a gate including a gate dielectric layer 320 and a conductive layer 310. Gate dielectric layer 320 may be an oxide of the substrate for example. Formed on one side of the gate is source doped region 335, while formed on the other side of the gate is resistor/drain doped region 330. In one embodiment these doped regions are lightly doped portions of the substrate 300 which are referred to as the source/drain extension.

Formed around the gate and above a portion of the resistor/drain doped region 330 and above source doped region 335 are spacers 340. Spacers 340, in one embodiment, are formed of an oxide of the substrate 300. Part of resistor/drain doped region 330 is not covered by a spacer 340, and formed on top of this portion is insulator 350, which in one embodiment is formed from the same oxide which forms part of the spacers 340. In one embodiment, the spacers 340 are formed on two sides of the gate out of a combination of an oxide and nitride of silicon. However, it will be appreciated that many materials may be used to form spacer 340, though it is preferable that those materials have an electrically insulating character. Spacers 340 are often included to satisfy design rules concerning the placement of various features on a semiconductor, such as hot electron robustness of the gate.

Formed on one side of doped region 335 and the opposite side of doped region 330 are contact regions. Contact region 365 is a contact for a drain of the insulated gate FET, and contact region 360 is a source contact of the insulated gate FET. In one embodiment, contact regions 360 and 365 are heavily doped portions of substrate 300, and they may be formed for the purpose of achieving an ohmic contact with a conductor.

Figure 3:
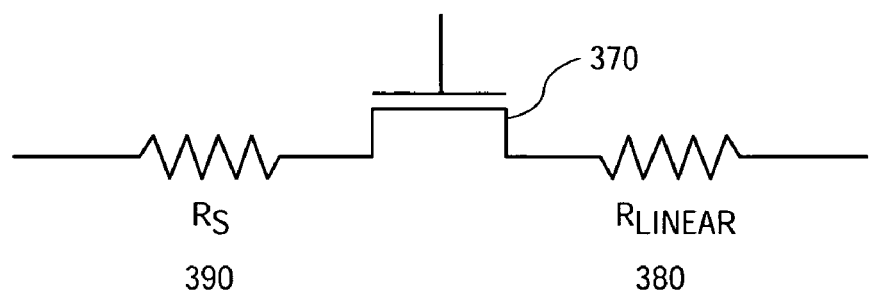
FIG. 3 illustrates a schematic of the insulated gate FET of FIG. 2.

FIG. 3 illustrates a schematic of the insulated gate FET of FIG. 2. Insulated gate FET 370 is the ideal insulated gate FET, while $R_S$ 390 represents the area of doped region 335 and $R_{LINEAR}$ 380 represents the area of doped region 330. $R_{LINEAR}$ 380 may be controlled during formation such that it is resistive enough to provide a convenient resistor for the output stage of a buffer used to drive a transmission line. The following table illustrates the characteristics of several different types of resistors that may be formed in a semiconductor device and their properties.

| Resistor Type | Range of Values (Ω/sq) | Relative Accuracy (%) | Temp. Coeff. (ppm/V) | Voltage Coeff. (ppm/V) | Absolute Accuracy (%) |
|---|---|---|---|---|---|
| Diffused (Unsilicided) | 10–100 | 2% | 1500 | 200 | 35% |
| Diffused (Silicided) | 2–3 | | | | |
| Poly (Unsilicided) | 30–200 | 2% | 1500 | 100 | 30% |
| Poly (Silicided) | 2–3 | | | | |
| P-Well | 1–10000 | 2% | 8000 | 10000 | 40% |
| Pinch | 5–20000 | 10% | 10000 | 20000 | 50% |
| Ion Implanted | 0.5–2000 | 1% | 400 | 800 | 5% |

As will be appreciated, the last entry represents the resistance formed through ion implantation or diffusion such as that used to form the resistor/drain doped region 330. This type of resistor exhibits a balance of the various properties illustrated in the table, and thus may be expected to form a fairly predictable and repeatable resistance during manufacture of a semiconductor.

Figure 4A:
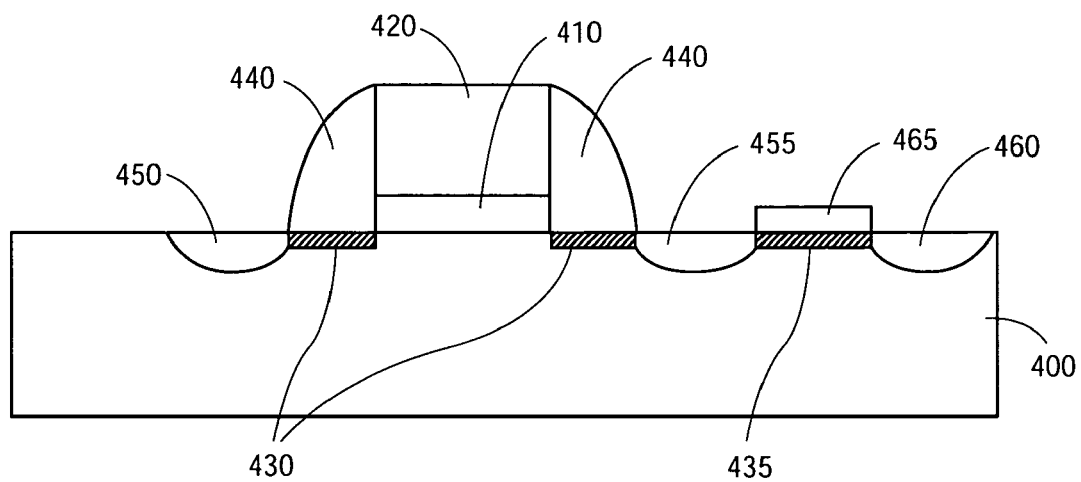
FIG. 4A illustrates an alternate embodiment of an insulated gate FET.

FIG. 4A illustrates another alternate embodiment of an insulated gate FET. Substrate 400 may also be a semiconductor or a doped portion of a semiconductor. Formed on substrate 400 is a gate including a gate dielectric layer 410 and a conductive layer 420. Formed on either side of the gate are source/drain doped regions 430, while formed on the drain side of the gate is resistor doped region 435. In one embodiment each of these doped regions (430 and 435) are lightly doped portions of the substrate 300.

Formed around the gate and above the source/drain doped regions 430 are spacers 440. Resistor doped region 435 is not covered by a spacer 440. Formed on top of doped region 435 is insulator 465, which in one embodiment is formed from the same oxide which forms part of the spacers 440. Formed on the source side of the insulated gate FET adjacent to doped region 430 is contact 450 which may be used as a source contact. Formed between source/drain doped region 430 and resistor doped region 435 is contact 455 which may be used as a drain contact. Formed beyond and adjacent to resistor doped region 435 is contact 460, which may be used as a linearized drain contact.

Figure 4B:
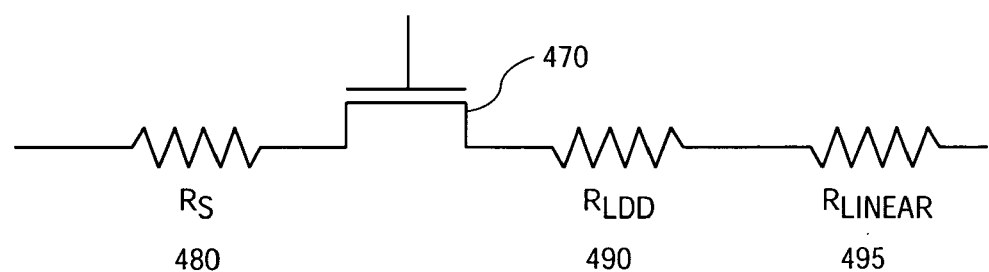
FIG. 4B illustrates a schematic of the insulated gate FET of FIG. 4A.

FIG. 4B illustrates a schematic of the insulated gate FET of FIG. 4A. Insulated gate FET 470 is the ideal insulated gate FET, while $R_S$ 480 represents the source area of source/drain doped regions 430. $R_{LDD}$ 490 represents the drain area of source/drain doped regions 430. $R_S$ 480 and $R_{LDD}$ 490 may be resistive enough that they can be modeled as part of the insulated gate FET. $R_{LINEAR}$ 495 represents the area of resistor doped region 435. $R_{LINEAR}$ 495 may be controlled during formation by properly placing the contact 460 (linearized drain contact) relative to the contact 455 (drain contact) such that it is resistive enough to provide a convenient resistor for the output stage of a buffer used to drive a transmission line. As a result, the node between $R_{LDD}$ 490 and $R_{LINEAR}$ 495 may be used as an unlinearized drain contact to the device, while the unconnected end of $R_{LINEAR}$ 495 may be used as a linearized drain contact.

Furthermore, the layout illustrated in FIG. 4A may cure registration errors or misalignment when forming the resistor. The resistor is formed along with the formation of the source/drain and contact regions in common lithographic steps, rather than requiring additional lithographic steps and thus increasing the complexity of the process. Additionally, it will be appreciated that in general the layouts illustrated may be used for either NMOS or PMOS devices, they are not dependent on a particular type of dopant.

Figure 5A:
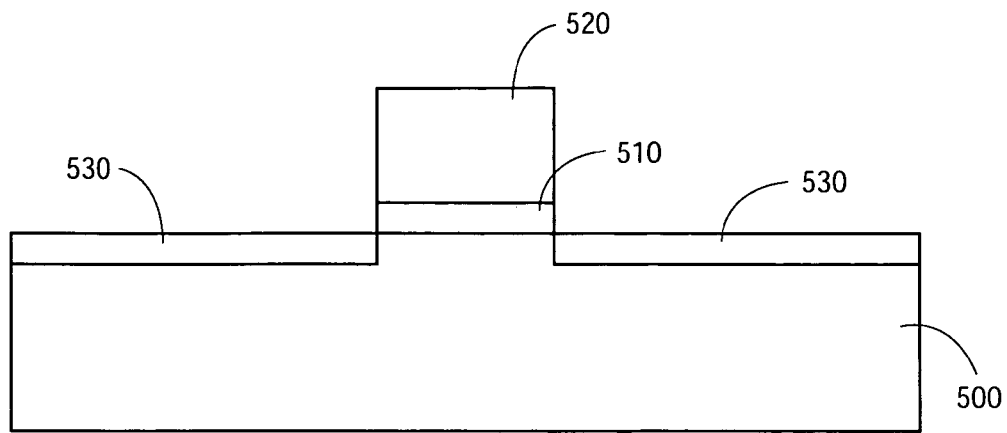
FIG. 5A illustrates an early stage of formation of an embodiment of an insulated gate FET.

FIG. 5A illustrates an early stage of formation of an embodiment of an insulated gate FET. Substrate 500 may be a semiconductor or a doped portion of a semiconductor. Formed on substrate 500 is a gate including a gate dielectric layer 510 and a conductive layer 520. In one embodiment, a thin oxide layer (of the substrate) is formed over the entire substrate 500 and a conductive layer is formed over the thin oxide layer. Then, both the conductive layer and the oxide layer are selectively etched to form the gate dielectric layer region 510 and conductive layer region 520. Formed on either side of the gate is source/drain doped region 530. In one embodiment these doped regions are lightly doped portions of the substrate 500.

Figure 5B:
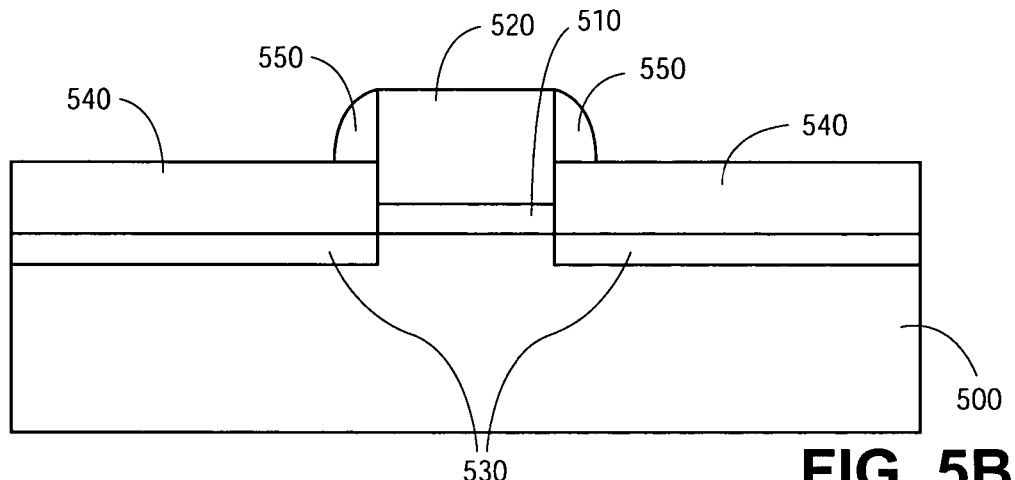
FIG. 5B illustrates an intermediate stage of formation of an embodiment of an insulated gate FET.

FIG. 5B illustrates an intermediate stage of formation of an embodiment of an insulated gate FET. The device as illustrated in FIG. 5A next has an insulating layer 540 formed on its surface. In one embodiment, this is a TEOS layer, formed through a CVD process, and it either is prevented from forming on the gate region or is selectively etched from the gate region. Note that the insulating layer 540 may be different in properties and thickness from the gate dielectric layer 510. Formed on top of insulating layer 540 is a second insulating layer which is then selectively etched to form the two spacers 550. Note that the overall spacer may actually be a combination of insulating layer 540 and spacer portions 550. In one embodiment, the spacers 550 are formed of a nitride of silicon and the insulating layer 540 is formed of an oxide of the substrate.

Figure 5C:
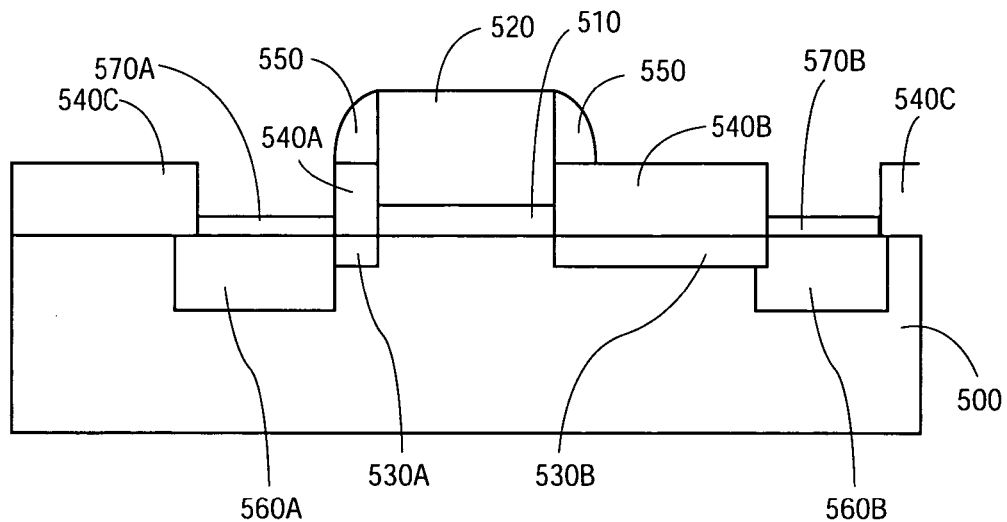
FIG. 5C illustrates a later stage of formation of an embodiment of an insulated gate FET.

FIG. 5C illustrates a later stage of formation of an embodiment of an insulated gate FET. Portions of insulating layer 540 are etched selectively, leaving insulating layer portions 540A, 540B, and 540C (a surrounding layer in one embodiment). Next, contact region doped regions are formed for the source and drain (effectively forming the source and drain), resulting in the formation of source contact region 560A and drain contact region 560B. Note that these contact regions disrupt the uniformity of the original source/drain doped region 530, resulting in the formation of source doped region 530A and drain doped region 530B. After the contact region doped regions are formed, a conductive material such as Titanium is deposited above the contact regions and then heated, resulting in the formation of source metal silicide 570A and drain metal silicide 570B. The resulting structure forms one embodiment of a linearized insulated gate FET structure. Other materials which may be used to form a silicide include but are not limited to Tungsten, Molybdenum, Cobalt, and Nickel.

Figure 6A:
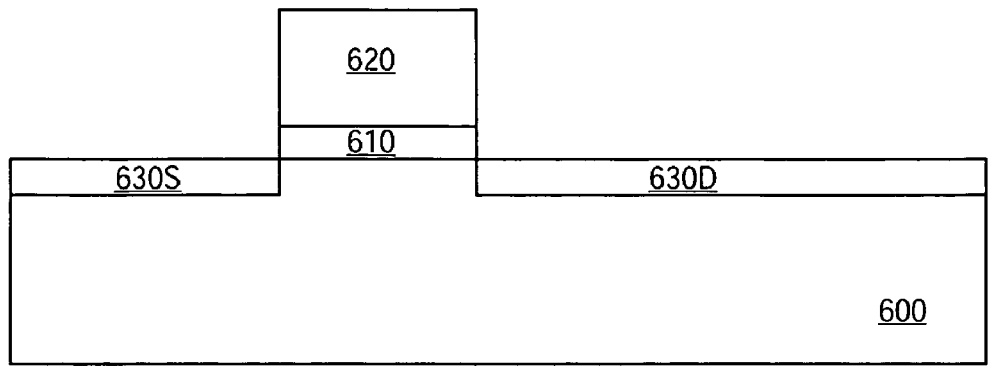
FIG. 6A illustrates an early stage of formation of an alternate embodiment of an insulated gate FET.

FIG. 6A illustrates an early stage of formation of an alternate embodiment of an insulated gate FET. Substrate 600 may be a semiconductor or a doped portion of a semiconductor. Formed on substrate 600 is a gate including a gate dielectric layer 610 and a conductive layer 620. Formed on one side of the gate is source doped region 630S and on the other side is drain doped region 630D. In one embodiment these doped regions (630S and 630D) are lightly doped portions of the substrate 600.

Figure 6B:
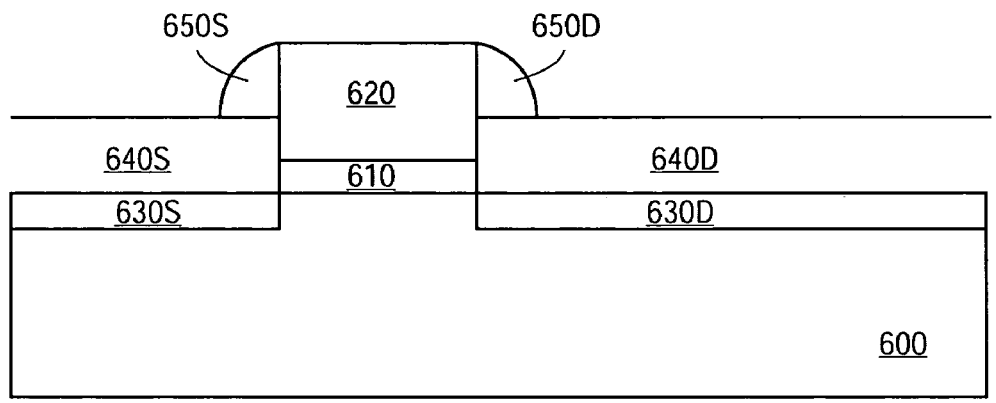
FIG. 6B illustrates an intermediate stage of formation of an alternate embodiment of an insulated gate FET.

FIG. 6B illustrates an intermediate stage of formation of an alternate embodiment of an insulated gate FET. The device as illustrated in FIG. 6A next has an insulating layer (such as an oxide of the substrate) formed on its surface resulting in insulating layers 640S and 640D. Formed on top of the insulating layer is a second insulating layer (such as a nitride of silicon) which is then selectively etched to form the two spacers 650S and 650D. Note that the overall spacer may actually be a combination of the insulating layer and the second insulating layer spacer portion.

Figure 6C:
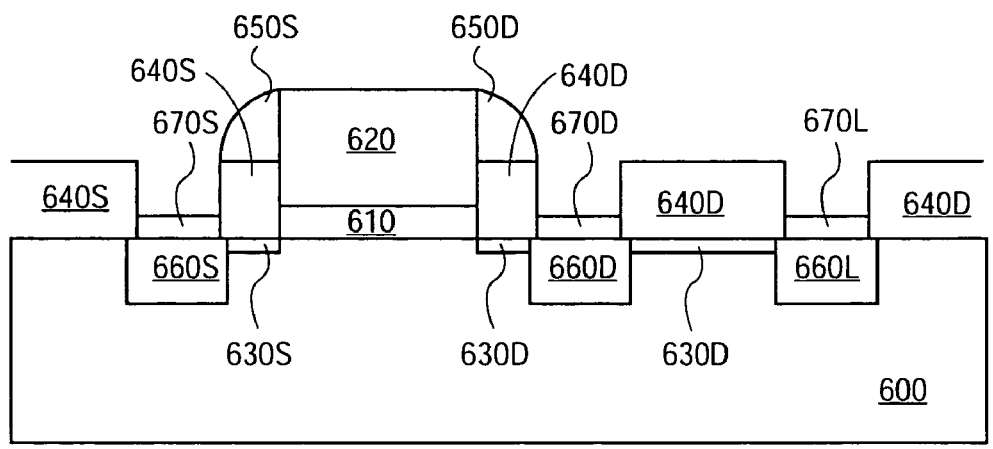
FIG. 6C illustrates a later stage of formation of an alternate embodiment of an insulated gate FET.

FIG. 6C illustrates a later stage of formation of an alternate embodiment of an insulated gate FET. Portions of the insulating layer are etched selectively, leaving insulating layer portions 640S and 640D. Next, contact region doped regions are formed, resulting in the formation of source contact region 660S, drain contact region 660D and linearized drain contact region 660L. Note that these contact regions disrupt the uniformity of the original source/drain doped regions 630S and 630D, resulting in the formation of the illustrated source extension area 630S and drain extension areas 630D. Moreover, note that the drain extension area 630D disposed between the regions 660D and 660L forms the resistor which results in the linearized drain property. After the contact region doped regions are formed, a conductive material such as Titanium is formed above the contact regions and heated, resulting in the formation of source metal silicide 670S, drain metal silicide 670D and linearized drain metal silicide 670L. The resulting structure forms an alternate embodiment of a linearized insulated gate FET structure.

Note that the resistivity of the various portions of the substrate is fairly predictable, so the location at which to form various regions such as the linearized contact region 660L for example, may be determined based on the expected resistivity of the doped region between the linearized drain contact region 660L and the drain contact region 660D and the desired resistance of the resulting series resistor. It will be appreciated that process variations may result in corresponding variations in the value of the resistor, and that determinations about where to form the contact region or other region tend to be made during design and layout of the circuit rather than during actual fabrication of the circuit.

Figure 7A:
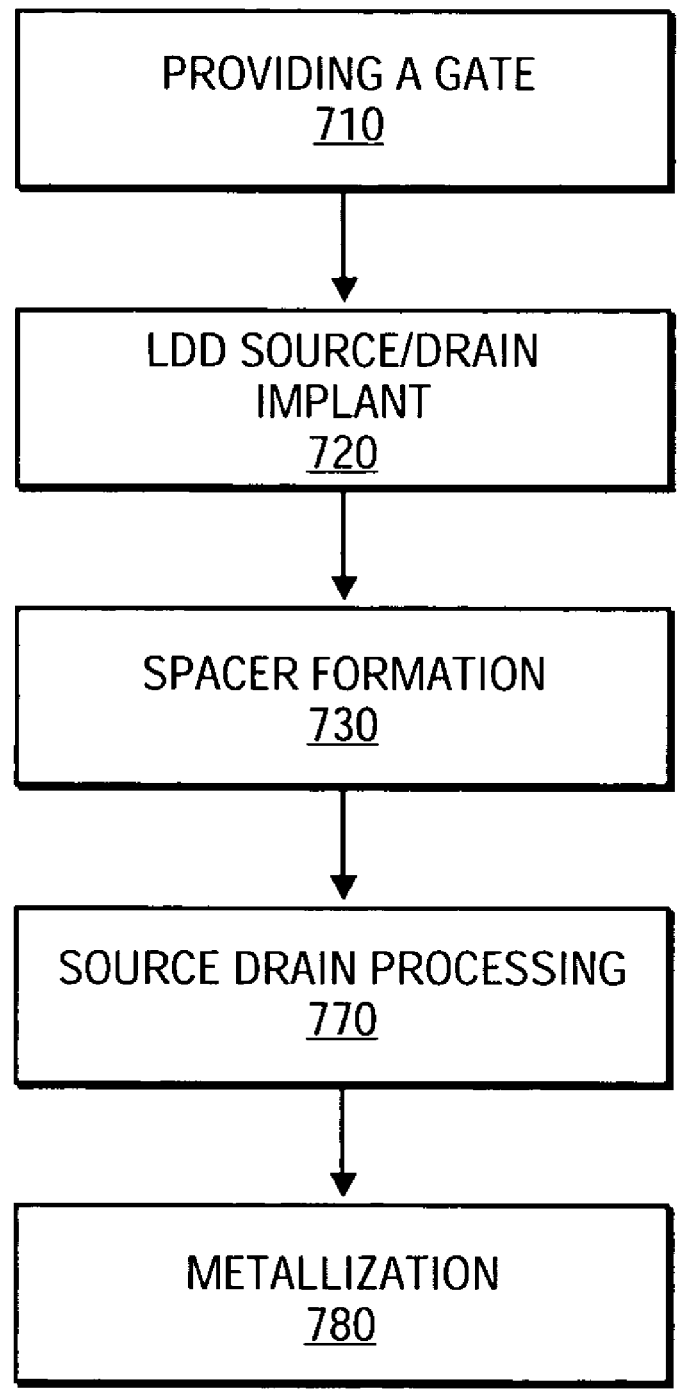
FIG. 7A illustrates an embodiment of a process of forming an insulated gate FET.
Figure 7B:
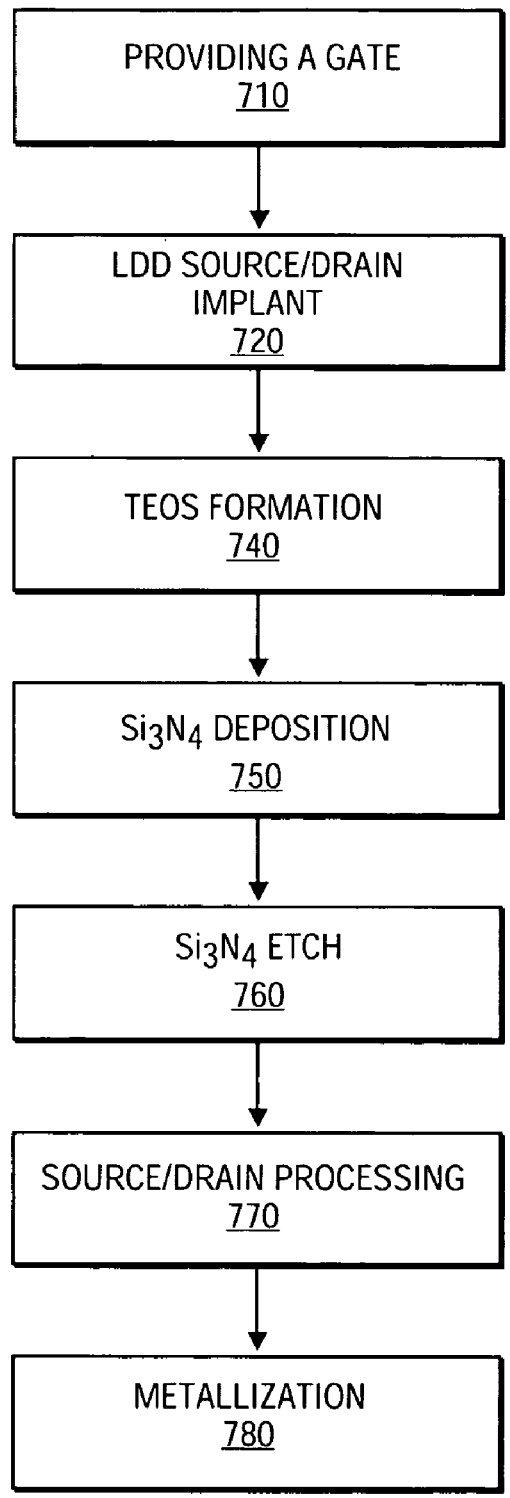
FIG. 7B illustrates an alternate embodiment of a process of forming an insulated gate FET.

FIG. 7A illustrates an embodiment of a process of forming an insulated gate FET. It will be appreciated that the processes illustrated in FIGS. 7A and 7B are illustrative and that one skilled in the art will understand that these illustrations pertain to portions of the process without detailing the implementation of many well-known techniques utilized in performance of these processes. At block 710 a gate is provided on a semiconductor substrate, such as forming and selectively etching an oxide and a conductor. At block 720 a LDD source/drain implant is performed. At block 730, a spacer is formed, such as a spacer made of a combination of two insulating layers such as $Si_3N_4$ and $SiO_2$.

At block 770 source/drain contact processing is performed. In one embodiment, this includes selectively etching the insulator(s) used to form the spacer and doping the actual source and drain regions to a high dopant concentration, while utilizing photoresist or a blocking material of some form to shield the rest of the semiconductor from the doping. Typically, the regions thus doped will principally serve as areas where contact with conductors may be made as discussed below. In relation to the earlier described layouts, this corresponds to the first part of formation of the contact regions, in which areas which may either be thought of as the actual source and drain or the contact portions of the source and drain are formed. Positioning of these source and drain regions results in definition of the area which serves as a series resistor coupled to the drain of the insulated gate FET. This positioning is designed with an understanding of what the resistivity should be for the area which will serve as the series resistor, often based on models of the process or results from use of the process prior to design activities. If the source and drain regions thus formed did not leave a sufficient lightly doped region, the high dopant concentration of the source and drain regions would result in a region nearly as conductive as polysilicon where the resistor was supposed to be formed.

Finally, at block 780, metallization is performed, in which metal is deposited in the source/drain contact regions to form conductive contact with the substrate. Metallization may involve either deposition (such as evaporation or CVD) of the metal on a photoresist pattern or deposition of the metal followed by deposition of a photoresist pattern and then an appropriate etch. Furthermore, metallization typically results in formation of a silicide bond at the junction between the deposited metal and the substrate, as the entire workpiece is heated to a sufficient temperature to cause silicidation to occur.

FIG. 7B illustrates an alternate embodiment of a process of forming an insulated gate FET. Formation of the spacer is further illustrated as formation of a first insulator such as a TEOS layer at block 740. The spacer formation further includes formation of a second insulation layer such as a $Si_3N_4$ layer at block 750. Finally, the spacer formation includes etching the second insulation layer such as etching a $Si_3N_4$ layer at block 760.

In the foregoing detailed description, the method and apparatus of the present invention has been described with reference to specific exemplary embodiments thereof. It will, however, be evident that various modifications and changes may be made thereto without departing from the broader spirit and scope of the present invention. For example, the apparatus of FIGS. 2 and 4A may be modified to conform to processing requirements while still fitting within the spirit and scope of the invention. Likewise, the processes of FIGS. 7A and 7B may be modified or may include many additional components or may include portions of the process performed in parallel within the spirit and scope of the invention. The present specification and figures are accordingly to be regarded as illustrative rather than restrictive.

What is claimed is:

1. A method comprising:
   forming a gate electrode on a substrate, the portion of the substrate covered by the gate electrode defining a channel;
   forming a source doped region and a drain doped region on laterally opposed sides of the gate electrode in the substrate;
   forming a spacer having a first insulating layer and a second insulating layer on laterally opposed sides of the gate electrode, wherein the first insulating layer and the second insulating layer are different materials;
   forming an unlinearized drain contact region abutting the drain doped region in the substrate;
   forming a resistor doped region abutting the unlinearized drain contact region in the substrate, the resistor doped region having an area to provide a resistivity to linearize a voltage transfer characteristic across the sourced doped region and to perform as a resistor for an output stage of a buffer used to drive a transmission line; and
   forming a linearized drain contact region abutting the resistor doped region.

2. The method of claim 1 further comprising:
   forming a source contact area within the source doped region, the source contact area formed simultaneously with the forming of the linearized drain contact region.

3. The method of claim 2 further comprising:
   forming a drain contact area within the drain doped region, the drain contact area formed simultaneously with the forming of the linearized drain contact region.

4. The method of claim 3 further comprising:
   forming a first contact hole through a layer disposed above the substrate to the substrate at a location within the linearized drain contact region;
   forming a second contact hole through the layer disposed above the substrate to the substrate at a location within the source contact area; and
   forming a third contact hole through the layer disposed above the substrate to the substrate at a location within the drain contact area;
   wherein each contact hole formed by selectively etching the layer disposed above the substrate.

5. The method of claim 2 further comprising:
   forming a first contact hole through a layer disposed above the substrate to the substrate at a location within the linearized drain contact region;
   forming a second contact hole through the layer disposed above the substrate to the substrate at a location within the source contact area;
   forming a conductor on the substrate through the first and second contact holes; and
   forming a silicide of the conductor and the substrate.

6. The method of claim 1 wherein:
   forming the spacer on laterally opposed sides of the gate electrode-includes:
   depositing the first insulating material on the substrate to form a layer disposed above the substrate;
   depositing the second insulating material on the layer disposed above the substrate; and
   selectively etching the second insulating material.

7. The method of claim 6 wherein:
   the first insulating material being an oxide of the substrate and the second insulating material being silicon nitride.

8. The method of claim 1 further comprising:
   forming the sourced doped region and the drain doped region by implanting ions into the substrate.

9. The method of claim 1 further comprising:
   forming the sourced doped region and the drain doped region by diffusing ions into the substrate.

10. The method of claim 1 wherein:
    forming the gate electrode includes:
    depositing a gate oxide;
    depositing a gate conductor;
    selectively etching the gate conductor and the gate oxide.

11. The method of claim 10 wherein:
    the substrate being silicon, a first insulating material deposited on the substrate being silicon oxide, and the gate conductor being poly-silicon.

12. A method, comprising:
    passing a current through an insulated gate Field Effect Transistor (FET) between a source and a drain of the insulated gate FET; and
    linearizing a voltage transfer characteristic of the insulated gate FET with a resistor doped region having an area to provide enough resistance for an output stage of a buffer used to drive a transmission line, wherein the voltage transfer characteristic is a graphical representative of a drain current versus a drain-to-source voltage relationship of the insulated gate FET.

13. The method of claim 12, wherein linearizing the voltage transfer characteristic includes passing the current through the drain, wherein an area of the drain to provide a resistivity to linearize the voltage transfer characteristic of the insulated gate FET.

14. The method of claim 12, wherein linearizing the voltage transfer characteristic includes passing the current through a resistor region adjacent to the drain, wherein an area of the resistor region to provide a resistivity to linearize the voltage transfer characteristic of the insulated gate FET.

15. A method of forming a transistor, comprising:
forming a gate on a substrate;
forming a source on a side of the gate in the substrate;
forming a drain on a laterally opposite side of the gate from the source in the substrate, the drain including a series resistor formed within the drain of the transistor and the series resistor abutting the gate, a resistivity of the series resistor based on an area of the drain, the series resistor to linearize a voltage transfer characteristic of the transistor and to provide enough resistance for an output stage of a buffer used to drive a transmission line;
forming a spacer having a first insulating layer and a second insulating layer on laterally opposed sides of the gate electrode, wherein the first insulating layer and the second insulating layer are different materials; and
forming a linearized drain contact region in the substrate adjacent to the drain on a laterally opposite side of the drain from the gate, wherein the drain is continuous between the gate and the linearized drain contact region and a contact is not located between the gate and the linearized drain contact region.

16. The method of claim 15, further comprising:
forming a source contact area in the substrate adjacent to the source on an opposite side of the gate from the linearized drain contact region, the source contact area formed simultaneously with the forming of the linearized drain contact region.

17. The method of claim 15, wherein the series resistor is formed by implanting ions into the substrate.

18. The method of claim 15, wherein the series resistor is formed by diffusing ions into the substrate.

* * * * *